United States Patent [19]
Chang et al.

[11] Patent Number: 4,970,781
[45] Date of Patent: Nov. 20, 1990

[54] PROCESS PLATE FOR PLASTIC PIN GRID ARRAY MANUFACTURING

[75] Inventors: Kin-Shiung Chang, Meriden, Conn.; Thomas A. Armer, Westborough, Mass.; Jeffrey S. Braden, Milpitas, Calif.; George A. Anderson, Old Lyme, Conn.

[73] Assignee: Olin Corporation, New Haven, Conn.

[21] Appl. No.: 391,913

[22] Filed: Aug. 10, 1989

[51] Int. Cl.⁵ .......................... H01R 9/00; B23P 21/00
[52] U.S. Cl. ......................................... 29/843; 29/721; 29/759; 29/760; 357/74; 439/877; 361/406
[58] Field of Search ............... 29/843, 845, 842, 760, 29/759, 721; 439/83, 877; 357/74, 80; 361/406

[56] References Cited

U.S. PATENT DOCUMENTS

| Re. 32,540 | 11/1987 | Murphy | 206/329 |
|---|---|---|---|
| 3,807,045 | 4/1979 | Bennett et al. | 29/845 |
| 4,535,535 | 8/1985 | Dines et al. | 29/845 |
| 4,549,651 | 10/1985 | Alemanni | 206/329 |
| 4,816,426 | 3/1989 | Bridges et al. | 437/207 |

FOREIGN PATENT DOCUMENTS

| 232837 | 8/1987 | European Pat. Off. | 357/74 |
|---|---|---|---|
| 63-74344 | 7/1988 | Japan | 357/74 |

OTHER PUBLICATIONS

IBM Tech. Discl. Bull., vol. 22, No. 4, Sep. 1979, pp. 1508-1509 by Renz.
Jedec Registration MO-083 entitled "Solid State Product Outline", 7/1/88.
*Materials Handbook* (Eleventh Edition) by Brady et al., McGraw-Hill Book Company, 1977 at pp. 533-535, 579-581 and 609-612.

Primary Examiner—Howard N. Goldberg
Assistant Examiner—Carl J. Arbes
Attorney, Agent, or Firm—Gregory S. Rosenblatt; Paul Weinstein

[57] ABSTRACT

A process plate for the manufacture of molded electronic packages such as plastic pin grid array packages is provided. The process plate is a single fixture which is used to position terminal pins, align the pins for electrical interconnection and form the base of the mold during encapsulation. In one embodiment, the process plate comprises a support plate which is used for all standard terminal pin configurations and a thin cover plate which is specific for each terminal pin configuration. The process plate reduces the number of fixtures required to mold an electronic package reducing both cost and assembly error.

37 Claims, 3 Drawing Sheets

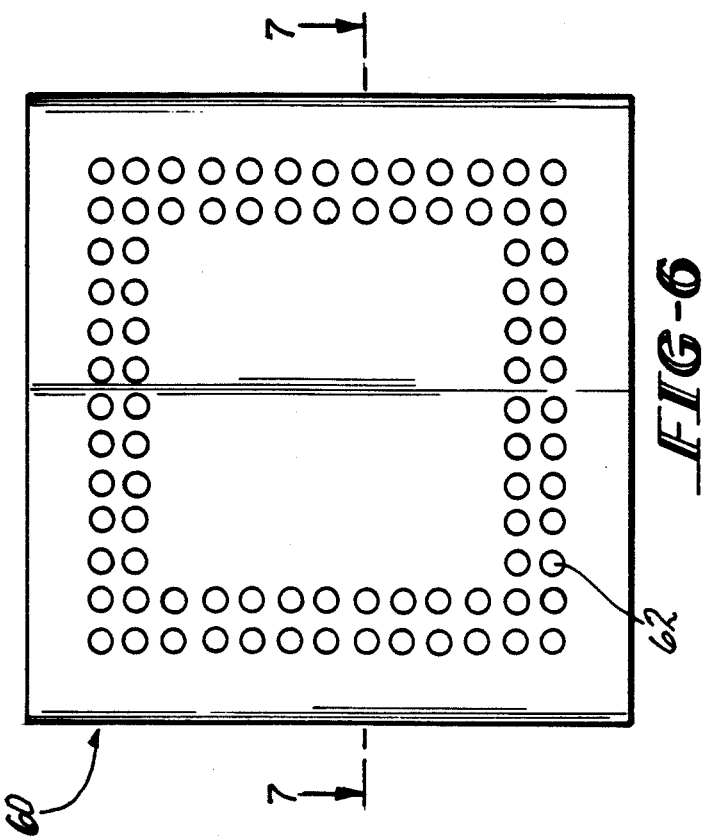
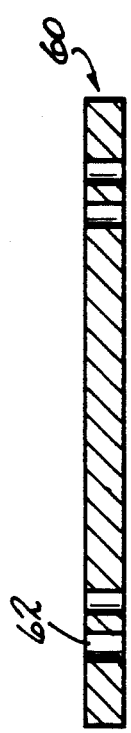
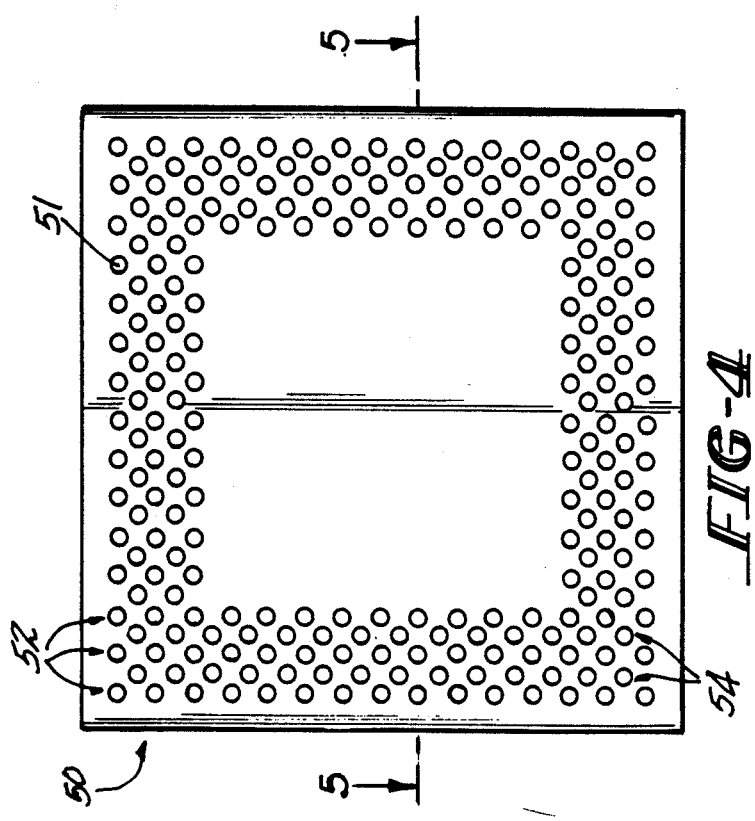
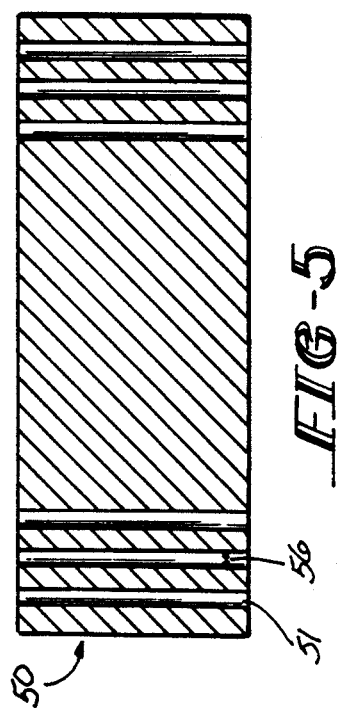

PROCESS PLATE FOR PLASTIC PIN GRID ARRAY MANUFACTURING

This application relates to U.S. patent application Ser. No. 145,977 entitled PROCESS FOR MANUFACTURING PLASTIC PIN GRID ARRAYS AND THE PRODUCT PRODUCED THEREBY by Chang et al, filed Feb. 2, 1988 which is incorporated herein by reference.

The present invention relates to a process plate used during the manufacture of molded plastic electronic packages. More particularly, the invention relates to a process plate for positioning terminal pins and the other components during the assembly of plastic pin grid array packages. One embodiment of the invention provides a universal process plate which positions terminal pins in any conventional array configuration.

A pin grid array (PGA) is an integrated circuit device comprising a generally flat and usually square body with an array of terminal pins projecting from a face of the body. The body is an electrically insulating material such as a ceramic or a plastic. The terminal pins are electrically conductive and are usually formed from copper, a copper base alloy, or a low expansion iron-nickel alloy such as KOVAR.

A depression within the package body is adapted to receive an electronic device such as a silicon based semiconductor device. The device is electrically interconnected to the terminal pins by metallized patterns extending from the terminal pins to the perimeter of the depression. Wire bonds or tape automated bonding bonds (TAB) electrically join the metallized pattern to individual bonding sites on the electronic device.

The terminal pins function to electrically connect the electronic device to external circuitry. The pins are typically arranged in a symmetric grid such as a single row of fifteen pins per side spaced along the perimeter of the body. This arrangement is referred to as a 15×15 grid.

To increase the number of pins and thereby the number of electrical connections to the device, a second symmetric grid of pins may be positioned within the first grid. For example, a 13×13 grid may be arranged within the 15×15 grid producing a PGA having 104 terminal pins.

There is some standardization of terminal pin spacing and grid size. Notably, JEDEC (Joint Electron Device Engineering Council) Registration MO-083 entitled "Solid State Product Outline" provides for 100 mil center to center spacing between terminal pins for up to a 20×20 grid.

Typically the center to center distance between terminal pins as well as the grid configuration vary from package to package. The multitude of package designs creates serious problems for the package manufacturer who must design tooling fixtures to position terminal pins during assembly operations.

U.S. Pat. No. 4,816,426 to Bridges et al discloses a process for manufacturing plastic pin grid array type packages. The terminal pins are loaded into an array of holes drilled into a loading fixture. The array matches the desired terminal pin configuration of the finished package.

A flexible or semi-rigid tape containing a desired metallized circuit pattern is bonded to the terminal pins. To facilitate bonding, through holes in the circuit tape are positioned at the points of contact with the terminal pins. The heads of the terminal pins pass through the holes and are electrically connected to the metallized circuit pattern such as by soldering.

The terminal pins—circuit tape assembly is then transferred to a second fixture which holds the terminal pins in proper alignment during molding. Molding comprises the encapsulation of at least a portion of the terminal pins and circuit tape with a polymer resin. Usually a process such as transfer or injection molding is employed. After molding, the terminal pins are held rigidly in place by the molding resin and additional fixturing is not required.

It may be seen that up to three fixtures are required to ensure proper alignment of the terminal pins; (1) during positioning of the circuit tape, (2) during soldering of the pins to the circuit tape and (3) during molding. The cost of fabricating three fixtures for each package design is quite significant. Each design requires a set of three fixtures. A multiplicity of holes, typically from about 64 to over 500, must be drilled in each fixture to tight tolerances. Typically the center to center spacing between terminal pins must be accurate to +/−5 mils. While 100 mil spacing is the standard at present, future PGA standards will probably require 50 mil center to center spacing or 100 mil center to center spacing with staggered rows. In the staggered configuration, the rows are separated by 50 mils. As the density of terminal pins increases, the complexity and cost of the molding fixtures will likewise increase.

Means to inexpensively support and position terminal pins in different configurations have been disclosed in U.S. Pat. No. RE 32,540 to Murphy as well as U.S. Pat. No. 4,549,651 to Alemanni.

U.S. Pat. No. RE 32,540 discloses the use of a thin plastic sheet to position the pins. The desired array of holes is punched into the plastic sheet which supports the pins for soldering. After soldering, the tape may be peeled away from the pin heads. The plastic sheet is not reusable and a separate sheet is punched for each PGA. A supporting fixture is required to hold the terminal pins in place during alignment of the plastic sheet. Each array pattern requires a separate fixture plate.

U.S. Pat. No. 4,549,651 discloses a carrier for a pin grid array. The carrier consists of a universal frame and a plastic insert having the desired array pattern which snaps into the frame. While the carrier is useful after the PGA is assembled, it does not support the terminal pins during assembly operations.

Therefore, in accordance with the invention, there is provided a process plate packages. It is an advantage of the invention that the process plate aligns and supports the terminal pins and other package components during both electrical interconnection and encapsulation. It is a feature of the invention that in one embodiment the process plate comprises a universal support plate designed to accept any standardized configuration of terminal pins and a thin mask plate patterned into the desired terminal pin configuration. It is an advantage of the two piece process plate that fixture tooling costs are reduced. It is another advantage of the invention that one molding fixture may be designed to accept the universal base plate and that pin grid arrays having any standardized terminal pin configuration may be encapsulated within the single molding fixture. A feature of this embodiment is the cover plate prevents the loading of terminal pins outside the desired configuration. A further advantage of the invention is that once loaded the pins remain in the process plate thereby reducing loading costs and increasing loading yields.

Accordingly, there is provided a process plate for the manufacture of electronic packages. The process plate comprises a support plate containing an array of support holes and a cover plate. The cover plate contains an array of positioning holes. The diameter of the positioning holes is greater than the diameter of the support holes. A means to align the cover plate and the support plate is provided so that each positioning hole is approximately concentric with a support hole.

The above-stated objects, features and advantages of the invention as well as others will become apparent to those skilled in the art from the specification and accompanying figures which follow.

FIG. 4 is a top planar view of a universal support plate in accordance with a second embodiment of the invention.

FIG. 5 is a cross-sectional representation of the universal support plate.

FIG. 6 is a top planar view of a cover plate in accordance with the second embodiment of the invention.

FIG. 7 is a cross-sectional representation of the cover plate.

Figure 3:
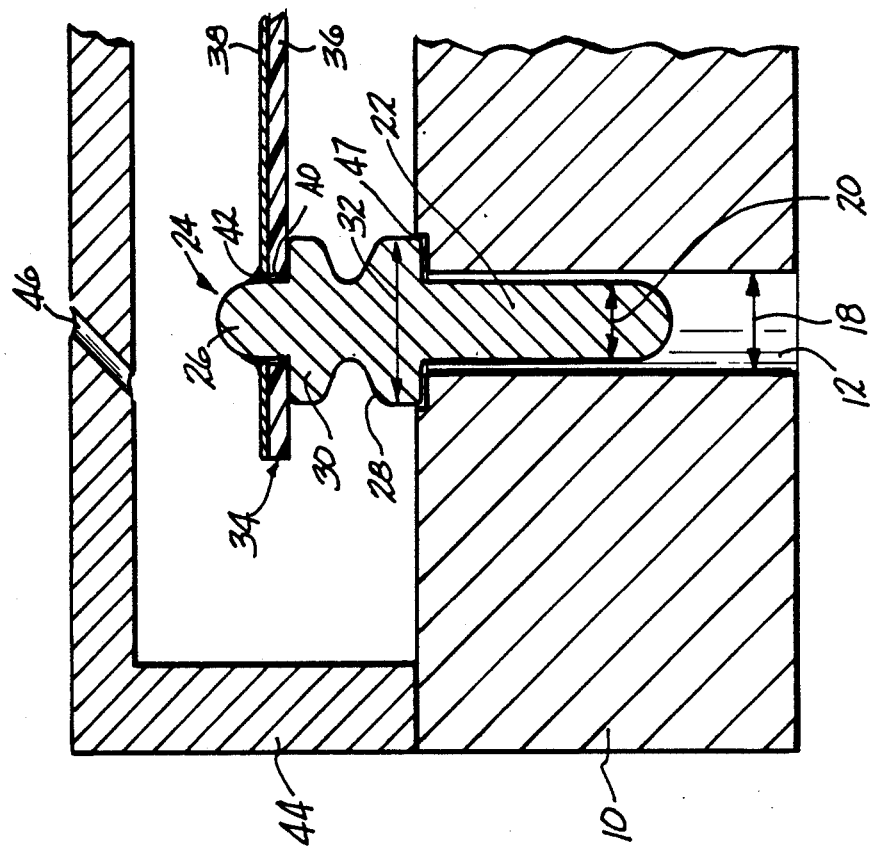
FIG. 3 is a cross-sectional representation of the use of the process plate during assembly of a molded pin grid array package.
Figure 1:
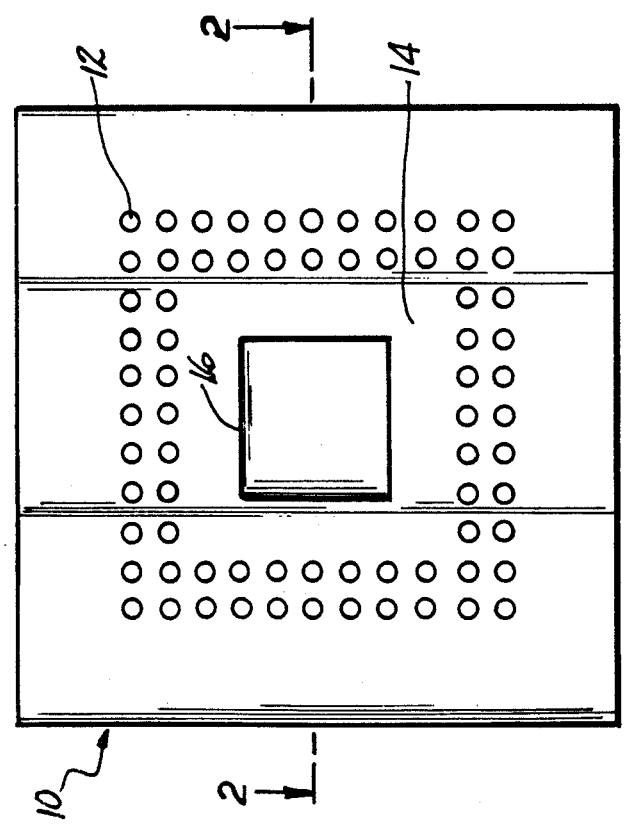
FIG. 1 is a top planar view of a process plate in accordance with a first embodiment of the invention.
Figure 2:
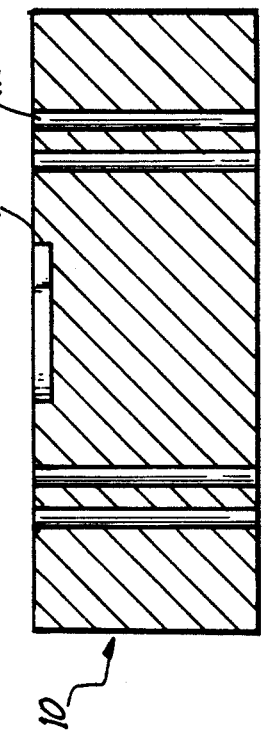
FIG. 2 is a cross-sectional representation of the process plate of the first embodiment of the invention.

In a first embodiment of the invention, a monolithic process plate 10 is illustrated in FIGS. 1 through 3. FIG. 1 illustrates in top planar view the process plate 10. FIG. 2 illustrates the process plate 10 in cross-sectional representation. The process plate 10 comprises an array of support holes 12 patterned into a desired configuration about a central region 14. The central region 14 locates the position of an electronic device (not shown). The electronic device which may be a silicon based semiconductor is subsequently electrically connected to terminal pins as discussed hereinabove.

Optionally, a centrally positioned depression 16 is provided. The depression 16 is adapted to receive a heatsink. The heat sink is then at least partially encapsulated by the molding resin.

The configuration of the support holes 12 is identical to the desired pattern of terminal pins in the molded pin grid array package. The diameter of the support holes 12 is slightly larger than the diameter of the insertion end of the terminal pins.

As shown in FIG. 2, the support holes 12 extend through the process plate 10 to facilitate fabrication. It is within the scope of the invention to employ blind holes which terminate within the thickness of the process plate 10. The thickness of the process plate 10 is that sufficient to support the terminal pins throughout the assembly process and to isolate the insertion end of the pins from polymer resin during encapsulation. A plate thickness of at least about 0.100 inches is generally desirable. More preferably, the process plate thickness is from about 0.150 inches to about 0.250 inches.

The process plate 10 is manufactured from a metal or metal alloy which is easy to machine and thermally stable at soldering temperatures of about 250° C. A thermally stable material is one which does not melt, warp, corrode, oxidize or otherwise non-reversibly deteriorate when exposed to the soldering temperature. Preferred process plate materials include steel, anodized aluminum and high strength copper alloys. Other suitable materials include titanium and high temperature thermoplastics such as liquid crystal polymer, polyamide-imide, polyetherimide, polyethersulfone, polyphenylenesulfide and polyether-etherketone. Any of the thermoplastics may further be filled with a secondary material to improve the properties. A tool steel such as AISI D2 detailed hereinbelow is the preferred material from which to manufacture the process plate 10.

With reference to FIG. 3, the use of the process plate through the assembly operations of pin loading, circuit tape positioning, soldering and molding is illustrated. FIG. 3 shows a portion of the process plate 10. The process plate 10 includes a plurality of support holes 12 having a diameter 18. The support hole diameter 18 is slightly more than the diameter 20 of the insertion end 22 of the terminal pins 24. Typically, the diameter of the support holes 12 will be from about 0.001 inches to about 0.010 inches greater than the diameter 20 of the insertion ends of the terminal pins 24. The preferred support hole diameter 18 is from about 0.005 inches to about 0.008 inches greater.

The terminal pins 24 comprise an insertion end 22 and a pin head end 26. Disposed between the insertion end 22 and pin head 26 are first 28 and second 30 annular shoulders. The diameter 32 of the first shoulder 28 is larger than the diameter 18 of the support hole 12. The diameter (not shown) of the second shoulder 30 is larger than the diameter of the pin head and typically although not necessarily the same as that of the first shoulder 28. While FIG. 3 illustrates the first and second shoulders as distinct components of the pin, the first and second shoulders may be incorporated into a single structure as illustrated in the above-cited U.S. patent application Ser. No. 145,977.

The terminal pin 24 is loaded into the process plate 10 by any conventional system, either manual or automated. One satisfactory automated system is a vibratory feeder. The terminal pin 24 is supported by the penetration of the insertion end 22 into the support hole 12. The depth of pin penetration is controlled by the first shoulder 28 which has a diameter 32 too large to enter the support hole 12.

Once the terminal pins are loaded, a circuit tape 34 comprising a dielectric carrier layer 36 and at least one metallized circuit layer 38 is inserted over the pin heads 26. Insertion is aided by apertures 40 having a diameter slightly larger than the diameter of the pin head 26.

A solder 42 or other bonding means is then applied to the circuit tape. The assembly is heated melting the solder 42 to bond and electrically interconnect the pin head 26 to the metallized circuit layer 38 of the circuit tape 34.

Following soldering, a molding cover 44 is positioned to surround the soldered assembly and to make intimate contact with the process plate 10. The interior dimensions of the molding cover are selected to define the peripheral dimensions of the PGA package. A polymer resin, for example a thermoset epoxy, is introduced by any known means, such as gate 46. The polymer resin may be filled with an inorganic medium such as silica to improve its properties. The molding cover is designed so that the polymer resin encapsulates a portion of the assembly. The polymer resin is blocked from entering the support holes 12 by the first shoulder 28 of terminal pins 24. To improve the seal preventing resin penetration of the support holes, a countersink 47 may be provided. The diameter of the countersink 47 is slightly larger, by about 0.001 inches to about 0.005 inches, than the diameter of the first shoulder 28. When loaded in the process plate, the first shoulder rests in the countersink improving the seal. The insertion end 22 of the pins remain resin free and available for electrical interconnection to external circuitry.

Molding is effected by inserting the process plate/molding cover assembly in a conventional transfer or extrusion molding apparatus and introducing polymer resin through the gate 46.

The single piece process plate reduces the number of fixtures required to manufacture the molded plastic pin grid array package from three fixtures to a single fixture. The pins are loaded only once and remain within the process plate so assembly costs and error are reduced. However, the process plate must still be fabricated for each specific terminal pin configuration. The process plate 10 of FIG. 1 illustrates an 11×11 grid surrounding a 9×9 grid. The process plate 10 is useless for the assembly of other pin configurations such as a 13×13 grid or a 12×12 grid surrounding a 10×10 grid.

In accordance with a second embodiment of the invention, there is provided a universal process plate illustrated in FIGS. 4 through 8. FIGS. 4 and 5 illustrate a support plate 50 comprising a portion of the universal process plate. The support plate comprises a plurality of support holes 51 arranged in a multiplicity of desired array configurations. Both odd number configurations 52 and even number configurations 54 are provided on the same support plate 50. While the FIG. illustrates configurations from a 15×15 array to an 11×11 array, any size array may be utilized. It is believed the most useful arrays are from 50×50 through 9×9. The high density arrays such as 50×50 are utilized when the terminal pins configuration calls for staggered rows as discussed hereinabove. Both odd and even arrays are employed within the same configuration.

As with the monolithic process plate 10 described hereinabove, the diameter 56 of the support holes 51 is slightly larger than the diameter of the insertion end of the terminal pins to be assembled into the molded pin grid array. The thickness of the support plate 50 is that sufficient to support the terminal pins throughout assembly and to isolate the insertion ends during encapsulation. A thickness of at least about 0.100 inches is desirable. More preferably, the thickness of the support plate is from about 0.150 inches to about 0.250 inches.

A depression adapted to receive a heat sink may be fabricated in the support plate as discussed above for the monolithic process plate.

The composition of the support plate 50 is any material which can withstand the soldering temperature while retaining thermal stability. The materials described above for the monolithic process plate are exemplary. A preferred material for the support plate is the tool steel given the AISI designation D2. The D2 steel comprises 11%–13% chromium, 1.4%–1.6% carbon, 0.7%–1.2% molybdenum, 1.10% vanadium, 1.00% cobalt, less than 1% of manganese, phosphorous, sulfur and silicon and the balance iron. D2 is a preferred support plate material because it is easily machined and maintains dimensional stability at molding temperatures.

A second component of the universal process plate is the cover plate. FIG. 6 is a top planar view of the cover plate 60 while FIG. 7 illustrates the cover plate 60 in cross-sectional representation. The cover plate 60 contains an array of positioning holes 62 in the desired terminal pin configuration. The diameter of the positioning holes is slightly larger than the diameter of the first shoulder of the terminal pins to be encapsulated. Since the positioning holes align the terminal pins to close tolerances, the diameter of the positioning holes is preferably from about 0.001 inches to about 0.010 inches greater than the diameter of the first shoulder.

The cover plate 60 is relatively thin. The cover plate 60 thickness is less than about 0.100 inches and preferably on the order of from about 0.002 inches to about 0.060 inches thick. A most preferred cover plate thickness is from about 0.006 inches to about 0.020 inches. The cover plate 60 may be manufactured from any material which is capable of withstanding the soldering temperatures of about 250° C. The cover plate should further not be a material to which the molding resin readily adheres. The cover plate 60 is preferably made from a readily fabricated material. While any of the materials listed hereinabove for the monolithic process plate may be employed, type 304 stainless steel is a preferred material because it is easily fabricated and retains dimensional stability.

The positioning holes 62 are formed by any technique which assures accurate placement. A most preferred technique is etching. The cover plate 60 is coated with a photoresist and imaged according to conventional photolithographic techniques. The positioning hole locations are either exposed (if a negative photoresist is employed) or shielded (if a positive photoresist is employed) so that after imaging, the resist may be removed from the positioning hole locations with a solvent rinse. The cover plate 60 is then immersed in a suitable etchant to form the positioning holes 62. A suitable etchant for a 304 stainless steel cover plate is a 7% sulfuric acid solution.

Other suitable processes to form the positioning holes 62 include drilling, milling, CNC drilling, blanking, coining, piercing, electrodischarge machining and laser ablation.

Generally the positioning holes will be formed into a rectangular pattern such as a square grid. However, any standard configuration of terminal pins which align with the universal support plate holes may be patterned into the support plate.

Figure 8:
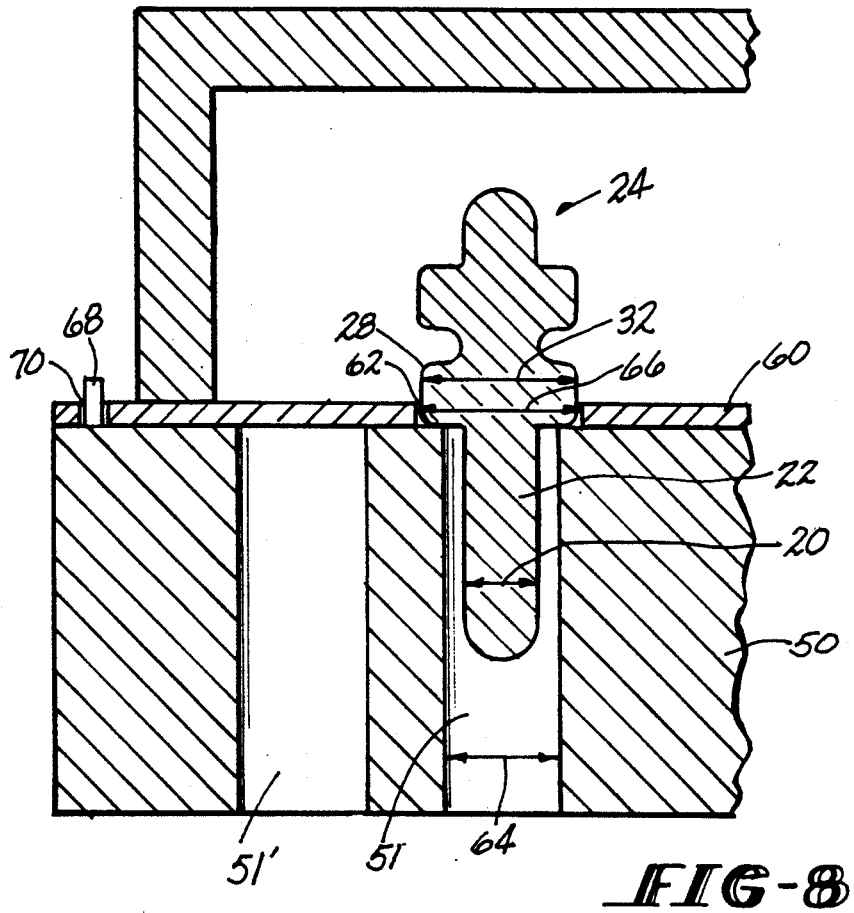
FIG. 8 is a cross-sectional representation of the universal support plate and cover plate during assembly of a molded pin grid array package.

FIG. 8 illustrates in cross-section the combination of a support plate 50 and a cover plate 60 to manufacture a molded pin grid array having a desired terminal pin configuration. The support plate 50 includes a plurality of support holes 51, only a portion of which are required for the desired terminal pin array. The cover plate 60 includes a plurality of positioning holes 62 which correspond to the desired terminal pin configuration. The terminal pins are loaded into the process plate either manually or by a mechanical feeding system. The excess support holes 51' are shielded by the cover plate 60. The terminal pins 24 are loaded only in the desired configuration.

The diameter 64 of the support holes 51 is larger than the diameter 20 of the insertion end 22 of the terminal pins. The diameter 32 of the first shoulder 28 of the terminal pins 24 is larger than the diameter 64 of the support holes 51. Thus the first shoulder 28 is incapable of penetrating the support plate 50 and all terminal pins 24 are supported at the same height.

The diameter 66 of the positioning holes 62 is larger than the diameter 64 of the support holes 51 and slightly larger than the diameter 32 of the first shoulder 28 of the terminal pins 24. The positioning holes 62 position the terminal pins 24 in substantially perpendicular orientation to the process plate in a desired array configuration.

An indexing means, for example a series of pins 68 extending from the base plate 50 through a series of apertures 70 in the cover plate 60, ensures alignment of the positioning holes 62 relative to the support holes 51. The indexing means is preferably located external to the molding cover to prevent resin bleed through. An external indexing means is not necessary, the terminal pins themselves may be used to align the positioning holes to the support hole.

Each positioning hole 62 is aligned to be approximately concentric with a support hole 51. The terminal pins are supported in essentially perpendicular relationship to the process plate fixture. Preferably, the axis of the terminal pin 24 lies along the axis of both the support hole 51 and the positioning hole 62.

Among the advantages of the two piece process plate is only the cover plate 60 must be fabricated for each configuration of terminal pins. The support plate 50 contains a universal matrix of support holes and may be employed for any standard size matrix. Although terminal pin configurations are usually in the form of a square matrix, by changing the position hole pattern on the cover plate, rectangular configurations, square matrices with missing pins or any other random configuration may be generated.

The cover plate 60 is relatively thin since its functions are to position the terminal pins and to mask undesired configurations, and not to support the pins during assembly operations. Preferably, the thickness of the cover plate is from about 0.002 inches thick to about 0.060 inches thick. The relative thinness of the cover plate facilitates fabricating to close tolerances. The fabrication cost is significantly less than manufacturing a process plate for every terminal pin configuration. The cover plate has adequate strength to be used multiple times. A new cover plate is not required for each molded pin grid array. A single cover plate is believed to be useful for the manufacture of thousands of molded plastic pin grid arrays without deteriorating.

Figure 9:
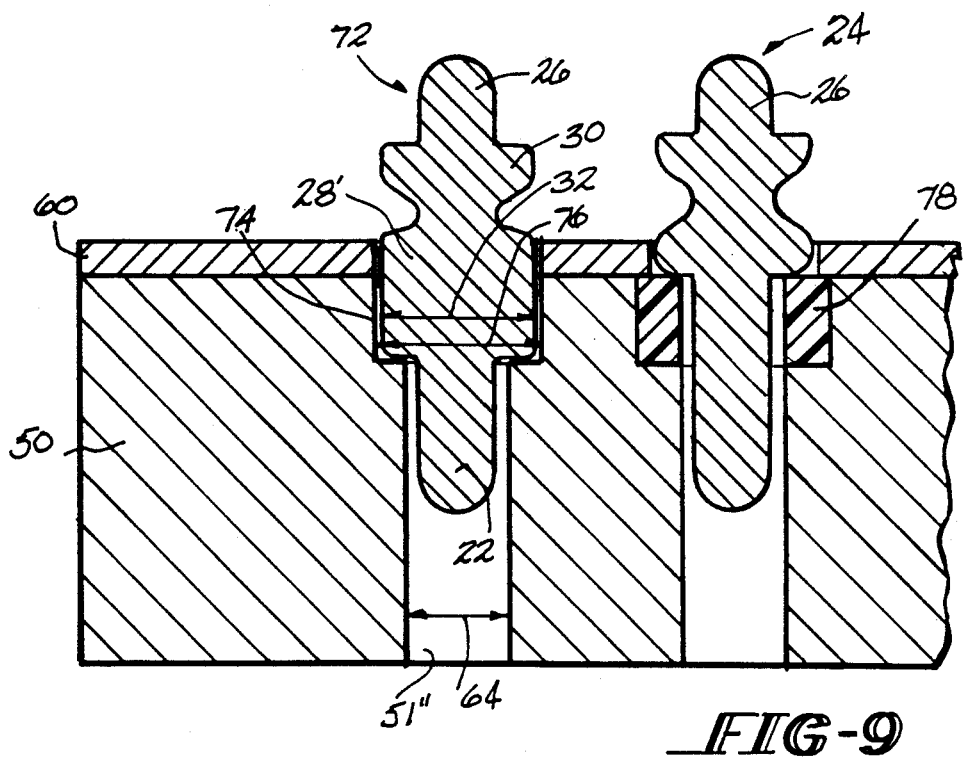
FIG. 9 is a cross-sectional representation of the universal support plate and cover plate wherein the support plate provides for stand-off pins.

As illustrated in cross-section in FIG. 9, molded pin grid array packages frequently include stand-off pins 72. Stand-off pins have an elongated first shoulder 28' which extends along the insertion end 22 of the pin. The elongated first shoulder 28' controls the depth to which the terminal pin array may be inserted into an external circuit such as a printed circuit board.

The pin head 26 and second shoulder 30 of the stand-off pin 72 is similar to those structures on the terminal pin. The stand-off pin head and second shoulder are employed in the same means as terminal pins. The circuit tape rests on the second shoulder and electrical interconnection is made by bonding to the pin head.

The process plate of the invention is able to position stand-off pins where desired. Rather then forming the support holes with a diameter 64 slightly larger than the diameter of the insertion end of the terminal pins but less than the diameter 32 of the first shoulder 28', the support holes 51" include a countersunk region 74 having a diameter 76 which is slightly larger than the diameter 32 of the first shoulder 28'. Since close tolerances are desired, the diameter of the countersunk region of the support hole is preferably from about 0.001 inches to about 0.010 inches greater than the diameter of the first shoulder. The depth of the countersunk region 74 is that necessary to align the height of the pin heads 26 of the stand-off pins 72 with the pin heads 26 of standard terminal pins 24.

No modification to the cover plate 60 is required for the process plate to accept the stand-off pins. The support holes 51" are countersunk. Since stand-offs are almost always positioned along the diagonal axes of the terminal pin array, only those support holes along a diagonal axis need to be countersunk. Alternatively, all holes may be countersunk so that the support plate 50 is universal for positioning of stand-off pins 72.

Not all countersunk holes 51" will be required for stand-off pins 72. If no pin is required at a given countersunk support hole, the hole is masked by the cover plate 60. If a standard terminal pin 24 is required, the countersunk diameter is reduced to the diameter 64 of the support holes. One method to reduce the diameter is inserting a stand-off plug 78 into the countersunk hole.

The stand-off plug is annular with an outside diameter about equal to the diameter 76 of the countersunk region 74 of the support hole 51". The inside diameter of the stand-off plug 78 is about equal to the diameter 64 of the support hole 51". The stand-off plug permits the insertion of terminal pins 24 into countersunk holes 51" without misalignment.

While the use of the process plate has been described in terms of pin grid array type packages, the invention is useful for molding of other electronic packages which require precise lead placement, for example, plastic dual-in-line (P-DIP) packages and molded quad type packages. Further, electrical and electronic connectors may also be manufactured according to the process plate concept.

While the process plate has been particularly described in terms of molded plastic electronic packages, the scope of the invention encompasses the use of a process plate for the manufacture of ceramic, cerglas and cermet package bodies as well.

The patents and patent application set forth in the application are intended to be incorporated by reference.

It is apparent that there has been provided in accordance with the invention a process plate for the molding of plastic pin grid array electronic packages which fully satisfies the objects, means and advantages set forth hereinbefore. While the invention has been described in combination with specific embodiments and examples thereof, it is evident that many alternatives, modifications, and variations will be apparent to those skilled in the art in light of the foregoing description. Accordingly, it is intended to embrace all such alternatives, modifications and variations as fall within the spirit and broad scope of the appended claims.

What is claimed is:

1. A method for the manufacture of a process plate to position terminal pins, comprising the steps of:
   a. patterning a plurality of support holes in a support plate formed from a material which is thermally stable at temperatures of about 250° C. such that said support holes form a series of grids and the diameter of said support holes is larger than the diameter of the insertion end of said terminal pins;

b. patterning a plurality of position holes in a cover plate formed from a material which is thermally stable at temperatures of about 250° C. such that said positioning holes form a desired terminal pin configuration and the diameter of said positioning holes is greater than the diameter of the insertion end of said terminal pins and slightly greater than the diameter of the first shoulder of said terminal pins; and c. aligning said positioning holes over corresponding support holes so that said holes are substantially concentric.

2. The method of claim 1 wherein said support holes are machined into a support plate having a thickness of at least about 0.100 inches, said support holes patterned into a series of square grids.

3. The method of claim 2 wherein at least a portion of said support holes are countersunk to contain a region with a diameter slightly greater than the diameter of said first shoulder of said terminal pins and adapted to receive stand-off pins.

4. The method of claim 3 including countersinking only those support holes located along a diagonal axis of said support plate grid.

5. The method of claim 3 including inserting an annular plug in those countersunk holes which are to receive terminal pins such that the diameter is about equal to the diameter of said support hole.

6. The method of claim 5 wherein said positioning holes are formed into a desired terminal pin configuration formed into said cover plate by drilling, milling, CNC drilling, blanking, coining, piercing, electrodischarge machining, laser ablation or photolithography.

7. The method of claim 6 wherein said positioning holes are formed into a desired terminal pin configuration by photolithography.

8. A process of manufacturing a molded pin grid array electronic package, comprising the steps of:

a. providing a process plate having an array of support holes patterned in a desired terminal pin configuration;

b. loading terminal pins into said process plate such that the insertion end of a terminal pin is within each said support hole;

c. placing a circuit tape over the heads of said loaded terminal pins such that said circuit tape rests on a second shoulder of said terminal pins;

d. electrically interconnecting said circuit tape to said pin heads;

e. placing a molding cover over said process plate to define the peripheral dimensions of said pin grid array;

f. encapsulating at least a portion of said circuit tape and said terminal pins except for said insertion end in a polymer resin; and g. removing said molded plastic electronic package from said molding cover and from said process plate.

9. The process of claim 8 wherein said step of loading said terminal pins comprises vibratory feeding.

10. The process of claim 9 wherein said electrical interconnection of said terminal pins to said circuit tape is by soldering.

11. The process of claim 10 wherein said process plate comprises a support plate and a cover plate, said support plate containing an array of support holes and said cover plate containing an array of positioning holes forming a desired terminal pin configuration, the diameter of said positioning holes being greater than the diameter of said support holes.

12. The process of claim 11 wherein said support holes form a series of grids having from 9×9 holes to 50×50 holes.

13. The process of claim 12 wherein the distance between said support holes is from about 0.050 inches to about 0.100 inches.

14. The process of claim 10 wherein a portion of the support holes are countersunk so that the diameter of the countersunk region is about equal to the diameter of said positioning holes.

15. The process of claim 14 wherein said countersunk support holes are located on the diagonals of said square grid.

16. The process of claim 14 including the step of inserting stand-off pins through desired positioning holes and countersunk support holes prior to the step of positioning said circuit tape.

17. The process of claim 14 including inserting an annular plug in those countersunk support holes which are to receive a terminal pin.

18. A process plate for the manufacture of electronic packages, comprising:

a support plate formed from a material which is thermally stable at temperatures of about 250° C. containing an array of support holes and adapted to receive a plurality of terminal pins;

a reusable cover plate formed from a material which is thermally stable at temperatures of about 250° C. and containing an array of positioning holes patterned into a desired configuration, the diameter of said positioning holes being greater than the diameter of said support holes and also, slightly greater than the diameter of a first shoulder of said terminal pins; and an indexing means to align said cover plate with said support plate such that each said positioning hole is approximately concentric with a support hole.

19. The process plate of claim 18 wherein said desired configuration of said positioning holes is the terminal pin configuration of a molded plastic electronic package.

20. The process plate of claim 19 wherein the diameter of said support holes is larger than the diameter of the insertion end of said terminal pins but smaller than the diameter of said first shoulder of said terminal pin.

21. The process plate of claim 20 wherein the diameter of said positioning holes is from about 0.001 inches to about 0.010 inches greater than the diameter of said first shoulder.

22. A process plate for the manufacture of electronic packages, comprising:

a support plate formed from a material which is thermally stable at temperatures of about 250° C. containing an array of support holes having a diameter larger than the diameter of the insertion end of a terminal pin, but smaller than the diameter of a first shoulder of said terminal pin, said support holes adapted to receive a plurality of terminal pins;

a reusable cover plate formed from a material which is thermally stable at temperatures of about 250° C. and containing an array of positioning holes having a diameter of from about 0.001 inches to about 0.010 inches greater than the diameter of said first shoulder, said positioning holes patterned into the configuration of a molded plastic electronic package; and an indexing means comprising a series of pins extending from said support plate to a series of apertures in said cover plate such that each said positioning hole is approximately concentric with a support hole.

23. A process plate for the manufacture of electronic packages, comprising:
a support plate having sufficient thickness to support the terminal pins through assembly and to isolate the insertion ends of said terminal pins during encapsulation, said support plate formed from a material which is thermally stable at temperatures of about 250° C. containing an array of support holes having a diameter larger than the larger than the diameter of the insertion end of said terminal pins but smaller than the diameter of a first shoulder of said terminal pins, said support holes adapted to receive a plurality of terminal pins;
a reusable cover plate formed from a material which is thermally stable at temperatures of about 250° C. and containing an array of positioning holes having a diameter of from about 0.001 inches to about to about 0.01 inches greater than the diameter of said first shoulder, said positioning holes patterned into the configuration of a molded plastic electronic package; and
an indexing means to align said cover plate with said support plate such that each said positioning hole is approximately concentric with a support hole.

24. The process plate of claim 23 wherein the thickness of said support plate is greater than about 0.100 inches and the thickness of said cover plate is less than about 0.100 inches.

25. The process plate of claim 24 wherein said thickness of said support plate is from about 0.150 inches to about 0.250 inches.

26. The process plate of claim 24 wherein the thickness of said cover plate is from about 0.002 inches to about 0.060 inches.

27. The process plate of claim 26 wherein the thickness of said cover plate is from about 0.006 inches to about 0.020 inches.

28. The process plate of claim 24 wherein said support plate and said cover plate are both independently selected from the group consisting of a metal or metal alloy, steel, anodized aluminum, high strength copper alloys, titanium, high temperature thermoplastics, liquid crystal polymer, polyamide-imide, polyetherimide, polyethersulfone, polyphenylenesulfide and polyetheretherketone.

29. The process plate of claim 28 wherein said support plate is selected to be a tool steel.

30. The process plate of claim 29 wherein said cover plate is selected to be stainless steel.

31. The process plate of claim 28 wherein said array of support holes consists essentially of a regularly spaced grid.

32. The process plate of claim 31 wherein said array of support holes consists essentially of a square grid comprising from 9×9 to 50×50 holes.

33. The process plate of claim 32 wherein said holes forming said square grid have center to center spacing of from about 0.050 inches to about 0.100 inches.

34. The process plate of claim 32 wherein at least some of the support holes comprising said square grid are adapted to receive a stand-off pin.

35. The process plate of claim 34 wherein at least some of said support holes contain a countersunk region having a diameter from about 0.001 inches to about 0.010 inches greater than the diameter of said first shoulder of said terminal pins.

36. The process plate of claim 35 wherein said support holes containing a countersunk region are located along the diagonals of said square grid.

37. The process plate of claim 35 wherein that portion of said support holes containing a countersunk region which will receive terminal pins rather than stand-off pins contains an annular plug having an inside diameter about equal to the diameter of the support hole.

* * * * *